United States Patent
Moon et al.

(10) Patent No.: US 10,620,547 B2
(45) Date of Patent: Apr. 14, 2020

(54) METHOD FOR CORRECTING A MASK LAYOUT AND METHOD OF FABRICATING A SEMICONDUCTOR DEVICE USING THE SAME

(71) Applicant: Samsung Electronics Co., Ltd., Suwon-si (KR)

(72) Inventors: Sung-Yong Moon, Seoul (KR); Sooryong Lee, Seoul (KR); Changhwan Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 17 days.

(21) Appl. No.: 16/030,061

(22) Filed: Jul. 9, 2018

(65) Prior Publication Data

US 2019/0155169 A1    May 23, 2019

(30) Foreign Application Priority Data

Nov. 23, 2017   (KR) .......................... 10-2017-0157209

(51) Int. Cl.
*G03F 7/20* (2006.01)
*G03F 1/70* (2012.01)

(52) U.S. Cl.
CPC ............ *G03F 7/70441* (2013.01); *G03F 1/70* (2013.01); *G03F 7/70625* (2013.01)

(58) Field of Classification Search
CPC .... G03F 7/70441; G03F 7/70625; G03F 1/70; G03F 1/36; G03F 7/705; G03F 7/20; H01L 21/0274
See application file for complete search history.

(56) References Cited

U.S. PATENT DOCUMENTS

| | | |
|---|---|---|
| 6,873,938 B1 | 3/2005 | Paxton et al. |
| 7,199,861 B2 | 4/2007 | Janssen et al. |
| 7,367,008 B2 | 4/2008 | White et al. |
| 7,541,290 B2 | 6/2009 | Chang et al. |
| 7,759,023 B2 | 7/2010 | Chen |
| 7,948,636 B2 | 5/2011 | De Groot et al. |
| 8,202,683 B2 | 6/2012 | Lee et al. |
| 9,484,186 B2 | 11/2016 | Song et al. |

(Continued)

FOREIGN PATENT DOCUMENTS

| | | |
|---|---|---|
| JP | 4262175 B2 | 5/2009 |
| KR | 10-2008-0082442 A | 9/2008 |
| KR | 10-1077453 B1 | 10/2011 |

*Primary Examiner* — Vuthe Siek
(74) *Attorney, Agent, or Firm* — Muir Patent Law, PLLC

(57) ABSTRACT

A method for correcting a mask layout includes providing a mask layout including first patterns, each of the first patterns having a size related to a first critical dimension (CD) value, obtaining topography data on a region of a wafer, generating a defocus map using the topography data, and correcting the mask layout on the basis of the defocus map. The generating of the defocus map includes respectively setting second CD values for a plurality of sub-regions of the mask layout. The second CD values may be set based on the topography data. The correcting of the mask layout on the basis of the defocus map comprises correcting the sizes of the first patterns to be related to the second CD values.

20 Claims, 11 Drawing Sheets

(56) References Cited

U.S. PATENT DOCUMENTS

| | | | |
|---|---|---|---|
| 2004/0121069 A1* | 6/2004 | Ferranti | G03F 1/74 427/140 |
| 2006/0199087 A1* | 9/2006 | Lucas | G03F 7/70441 430/30 |
| 2013/0176558 A1* | 7/2013 | Lin | G01B 11/24 356/237.5 |
| 2015/0219440 A1* | 8/2015 | Kim | G01B 11/0625 356/630 |

* cited by examiner

METHOD FOR CORRECTING A MASK LAYOUT AND METHOD OF FABRICATING A SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2017-0157209, filed on Nov. 23, 2017, in the Korean Intellectual Property Office, the disclosure of which is hereby incorporated by reference in its entirety.

BACKGROUND

Embodiments of the inventive concepts relate to a method for correcting a mask layout designed for fabrication of a photomask and a method of fabricating a semiconductor device using the same.

A photomask may be used to print an integrated circuit layout on a wafer in a photolithography process used for fabrication of a semiconductor device. Generally, the photolithography process may use a method of transferring mask patterns formed on the photomask to the wafer through an optical lens. The photomask may include a transparent region and an opaque region. The transparent region may be formed by etching a metal layer disposed on the photomask and may transmit light. On the other hand, the opaque region may not transmit light. The mask patterns may be formed by the transparent region and the opaque region. Light emitted from a light source may be irradiated to the wafer through the mask patterns of the photomask, and thus the integrated circuit layout may be printed on the wafer.

As an integration degree of a semiconductor device increases, the mask patterns of the photomask become closer to each other and a width of the transparent region becomes much narrower. Due to this proximity, interference and diffraction of light may occur, and thus a distorted layout different from a desired layout may be printed on the wafer. Optical proximity correction may be performed to prevent the distortion of the layout caused by these optical effects. In addition, process proximity correction may be performed to compensate distortion of the layout caused by a non-optical effect such as a process variation in a fabricating process of a semiconductor device.

The optical proximity correction and the process proximity correction may be performed based on a photolithography simulation that predicts a contour image to be formed on the wafer from a designed mask layout and a critical dimension (CD) of the contour image.

SUMMARY

Embodiments of the inventive concepts may provide a method for correcting a mask layout, which is capable of compensating distortion of a layout which may be caused by topography of a cell array region of a wafer.

Embodiments of the inventive concepts may also provide a method of fabricating a semiconductor device, which is capable of minimizing critical dimension (CD) dispersion of cell patterns on a cell array region of a wafer.

In an aspect, a method for correcting a mask layout may include providing a mask layout including first patterns, each of the first patterns having a size related to a first critical dimension (CD) value, obtaining topography data on a region of a wafer, generating a defocus map using the topography data, and correcting the mask layout on the basis of the defocus map. The generating of the defocus map may include respectively setting second CD values for a plurality of sub-regions of the mask layout. The second CD values may be set based on the topography data. The correcting of the mask layout on the basis of the defocus map may comprise correcting the sizes of the first patterns to be related to the second CD values.

In an aspect, a method of manufacturing a semiconductor device may include designing a mask layout including first patterns, each of the first patterns having a size related to a first critical dimension value, correcting the mask layout, fabricating a photomask having mask patterns corresponding to the corrected mask layout, and performing a photolithography process using the photomask on a wafer. The correcting of the mask layout may include generating a defocus map using topography data on a region of the wafer, and correcting the mask layout on the basis of the defocus map. The generating of the defocus map may include respectively setting second CD values for a plurality of sub-regions of the mask layout. The second CD values may be set based on the topography data.

BRIEF DESCRIPTION OF THE DRAWINGS

The inventive concepts will become more apparent in view of the attached drawings and accompanying detailed description.

DETAILED DESCRIPTION

Hereinafter, embodiments of the inventive concepts will be described in detail with reference to the accompanying drawings.

Figure 1:
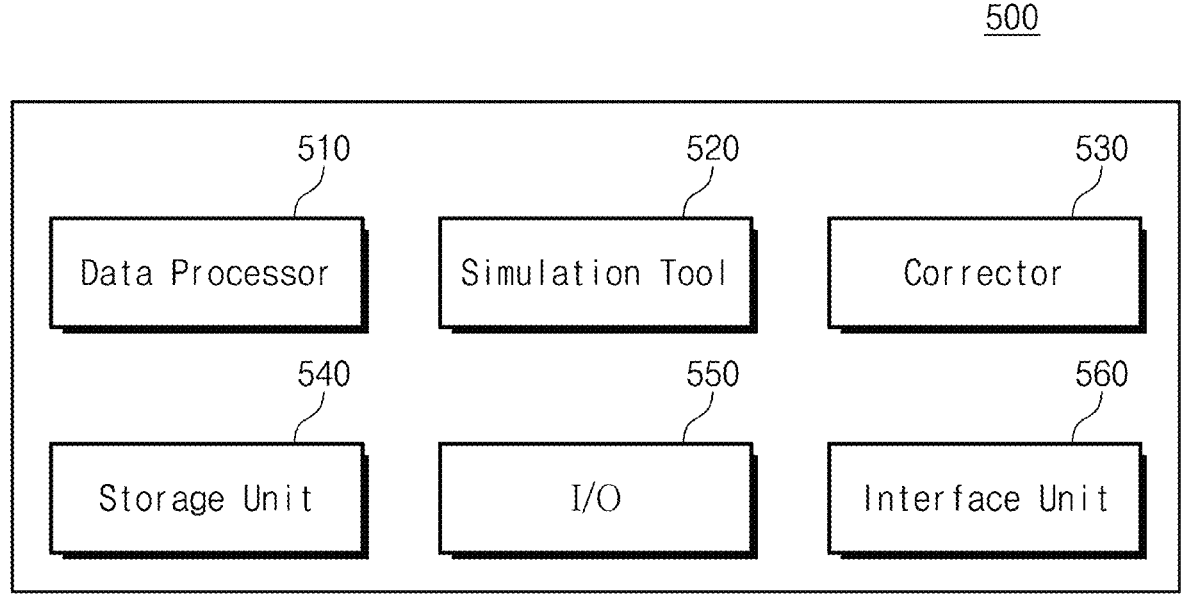
FIG. 1 is a schematic block diagram illustrating a computer system for performing a method for correcting a mask layout, according to some embodiments of the inventive concepts.

FIG. 1 is a schematic block diagram illustrating a computer system for performing a method for correcting a mask layout, according to some embodiments of the inventive concepts.

Referring to FIG. 1, a computer system 500 may include a data processor 510 for processing various data, a simulation tool 520 for performing a photolithography simulation on a designed mask layout, and a corrector 530 which compares data generated by the simulation tool 520 with desired data and corrects the mask layout when a difference between the generated data and the desired data is out of an allowable range. The computer system 500 may further include a storage unit 540 capable of storing various data. The storage unit 540 may include a hard disk and/or a non-volatile semiconductor memory device (e.g., a flash memory device, a phase-change memory device, and/or a magnetic memory device). The computer system 500 may further include an input/output (I/O) unit 550 and an interface unit 560. The I/O unit 550 may include at least one of a keyboard, a keypad, or a display device. Various data provided from the outside may be transferred to the computer system 500 through the interface unit 560, and various data processed by the computer system 500 may be transferred to the outside through the interface unit 560. The interface unit 560 may include at least one of a cable element, a wireless element, or a universal serial bus (USB). The data processor 510, the simulation tool 520, the corrector 530, the storage unit 540, the I/O unit 550 and the interface unit 560 may be connected or coupled to each other through a data bus.

Figure 2:
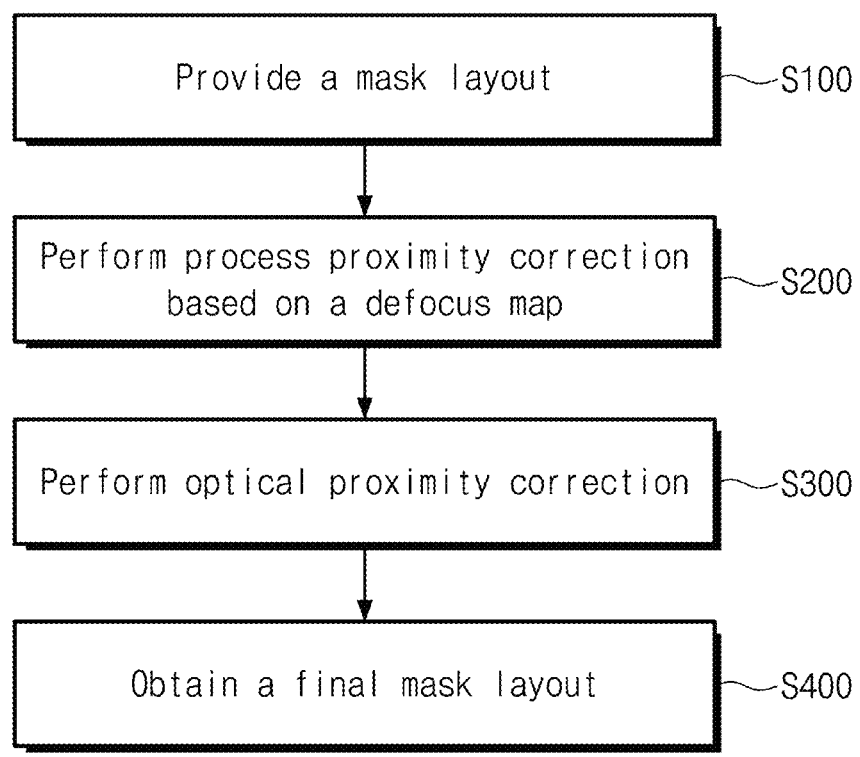
FIG. 2 is a flowchart illustrating a method for correcting a mask layout, according to some embodiments of the inventive concepts.
Figure 3:
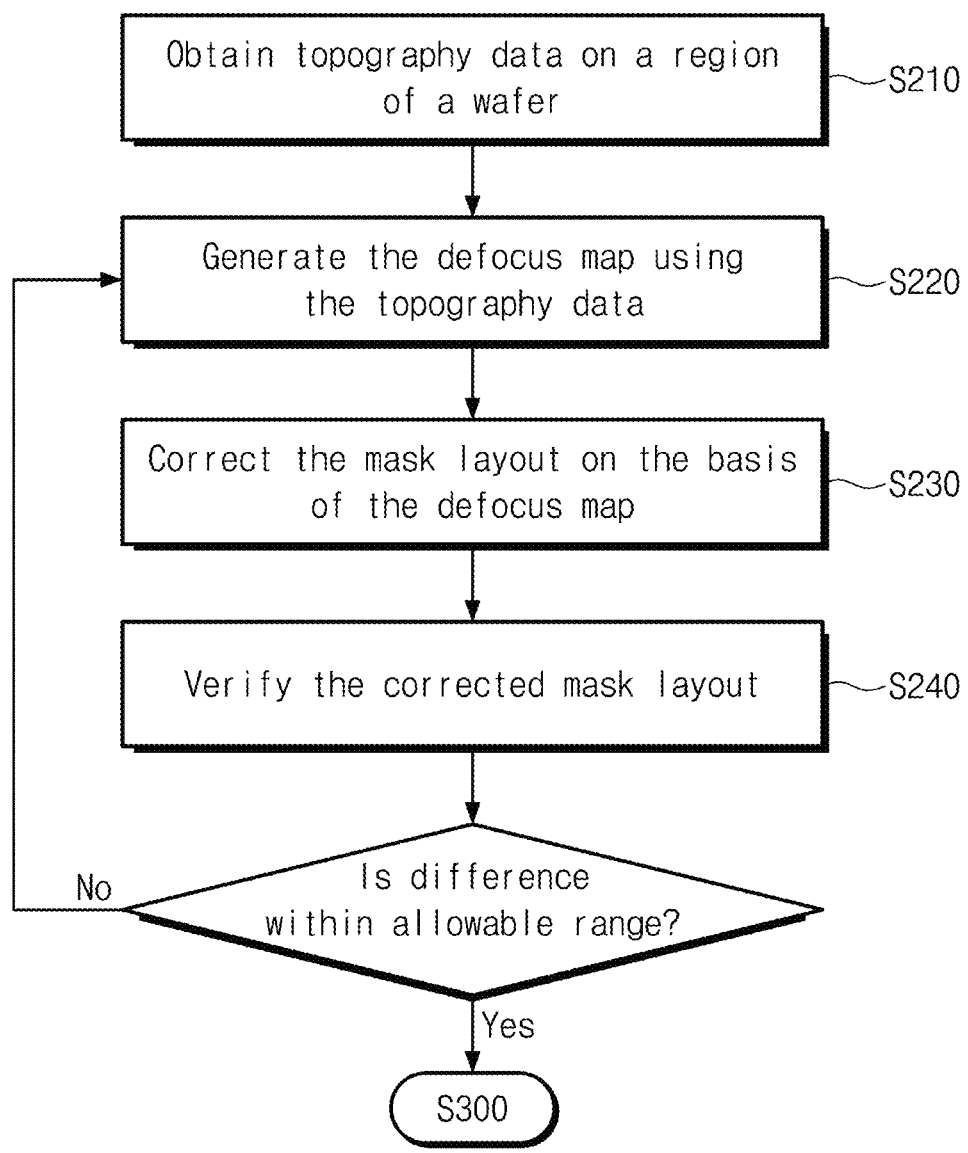
FIG. 3 is a flowchart illustrating an operation S200 of FIG. 2 in detail.
Figure 4:
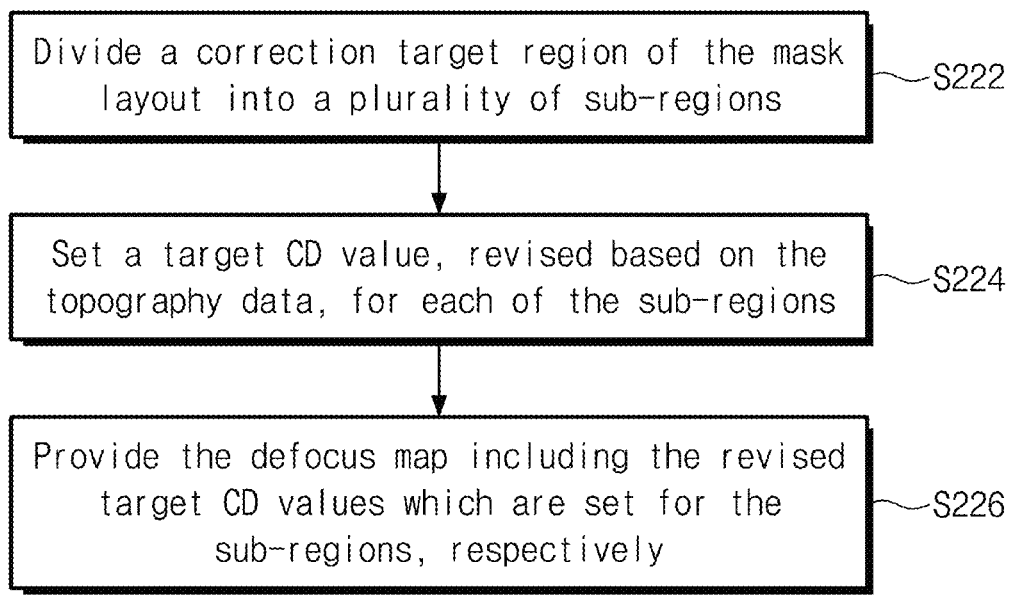
FIG. 4 is a flowchart illustrating an operation S220 of FIG. 3 in detail.
Figure 5:
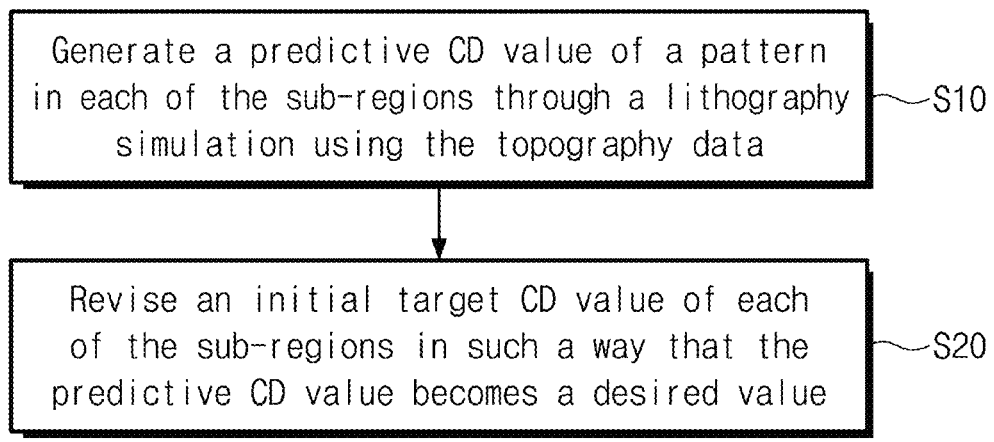
FIG. 5 is a flowchart illustrating an operation S224 of FIG. 4 in detail.

FIG. 2 is a flowchart illustrating a method for correcting a mask layout, according to some embodiments of the inventive concepts. FIG. 3 is a flowchart illustrating an operation S200 of FIG. 2 in detail, and FIG. 4 is a flowchart illustrating an operation S220 of FIG. 3 in detail. FIG. 5 is a flowchart illustrating an operation S224 of FIG. 4 in detail. FIGS. 6 to 14 are conceptual diagrams for describing a method for correcting a mask layout, according to some embodiments of the inventive concepts.

Figure 6:
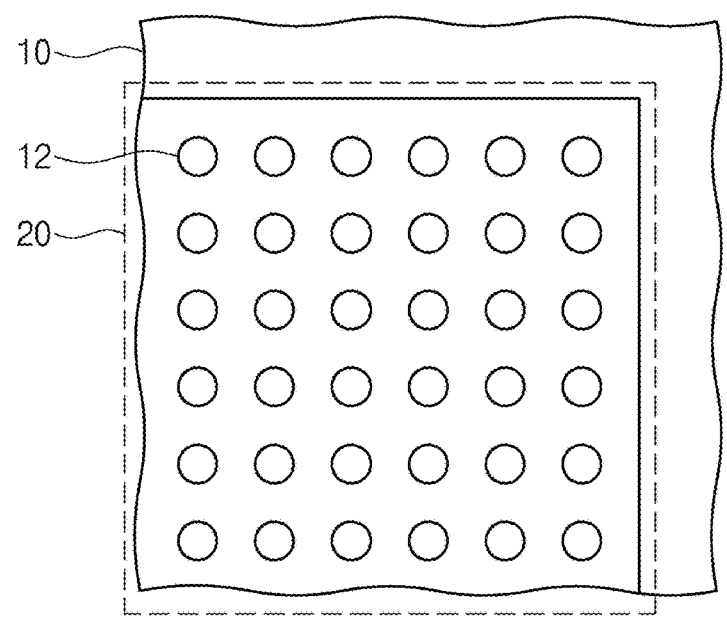
FIGS. 6 to 14 are conceptual diagrams for describing a method for correcting a mask layout, according to some embodiments of the inventive concepts.
Figure 7:
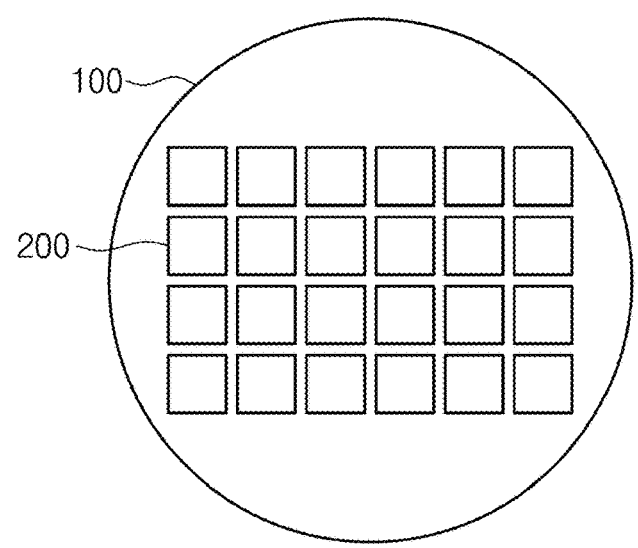

Referring to FIGS. 2 and 6, a designed mask layout 10 may be provided (S100). The mask layout 10 may include patterns 12 to be printed in an integrated circuit on a wafer. The patterns 12 of the mask layout 10 may define planar shapes of cell patterns to be formed on a cell array region of the wafer. In this case, the patterns 12 of the mask layout 10 may include repeatedly arranged same size patterns. The mask layout 10 may include data in an appropriate format (e.g., GDS II). For example, GDS II may be a data graphic system and may have a database file format. GDS II may have a binary file format representing planar geometric shapes and/or other information about the layout in hierarchical form. The GDS II data may be used to reconstruct part of layouts of photo masks.

Process proximity correction based on a defocus map may be performed on the mask layout 10 (S200). Before the process proximity correction is performed, a correction target region 20 of the mask layout 10 may be selected. The process proximity correction may be performed on the correction target region 20 of the mask layout 10. For example, the correction target region 20 may be a region where patterns are revised by a mask correction process.

For example, referring to FIGS. 3 and 7 to 9, topography data on a region of the wafer 100 may be obtained (S210). The wafer 100 may include a plurality of cell array regions 200, and a cell structure 140 may be provided on the cell array region 200 of the wafer 100. The cell structure 140 may include lower cell patterns 110, a first lower layer 120, and a second lower layer 130. The first lower layer 120 and the second lower layer 130 may be provided on the cell array region 200 to sequentially cover the lower cell patterns 110. Due to limitations of step coverage of the first lower layer 120, a top surface of the first lower layer 120 may be bent or curved across the cell array region 200. For example, the first lower layer 120 may have a bent/curved topography, e.g., a sloped topography. Throughout the disclosure, the bent/curved topography may be a topography that has a top surface of an element or component being bent or curved. The topography of the first lower layer 120 may be transferred to the second lower layer 130, and thus the cell structure 140 may have a bent/curved topography.

Figure 9:
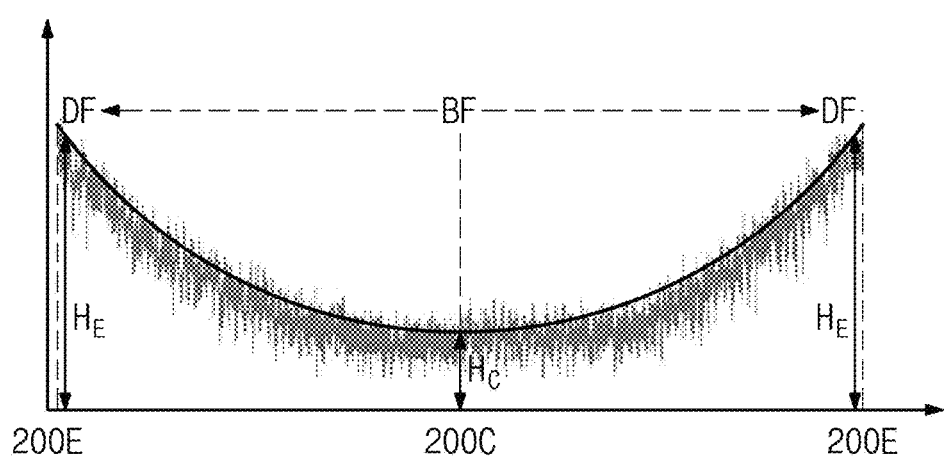

The topography data on the cell array region 200 of the wafer 100 may be obtained, as illustrated in FIG. 9. For an example, the topography data may be obtained by measuring a surface profile of the cell array region 200 of the wafer 100 (e.g., a surface profile of the cell structure 140) by using a scanning probe microscope, such as an atomic force microscope (AFM). In certain embodiments, the topography data may be obtained by measuring a height of a surface of the cell array region 200 of the wafer 100 (e.g., a height of a surface of the cell structure 140) through destructive inspection such as V-SEM. For example, the height H of the surface of the cell structure 140 may increase from a center 200C of the cell array region 200 to an edge 200E of the cell array region 200 (e.g., $H_C < H_E$).

When a photolithography process is performed to form cell patterns on the cell structure 140, defocus of the photolithography process may occur due to the topography of the cell structure 140. A degree of the defocus of the photolithography process may be varied depending on the topography which may be expressed with topography data of the cell array region 200. For example, a best focus BF of the photolithography process may be on the center 200C of the cell array region 200, and the degree of the defocus DF of the photolithography process may increase from the center 200C to the edge 200E of the cell array region 200. In this case, cell patterns corresponding to a distorted layout may be different from the designed layout of the mask layout 10, and may be printed on regions adjacent to the edge 200E of the cell array region 200.

The defocus map may be generated using the topography data (S220). The defocus map may be prepared to compensate the distortion of the layout in which the distortion is caused by the defocus of the photolithography process. Hereinafter, operations of generating the defocus map will be described in detail.

Figure 10:
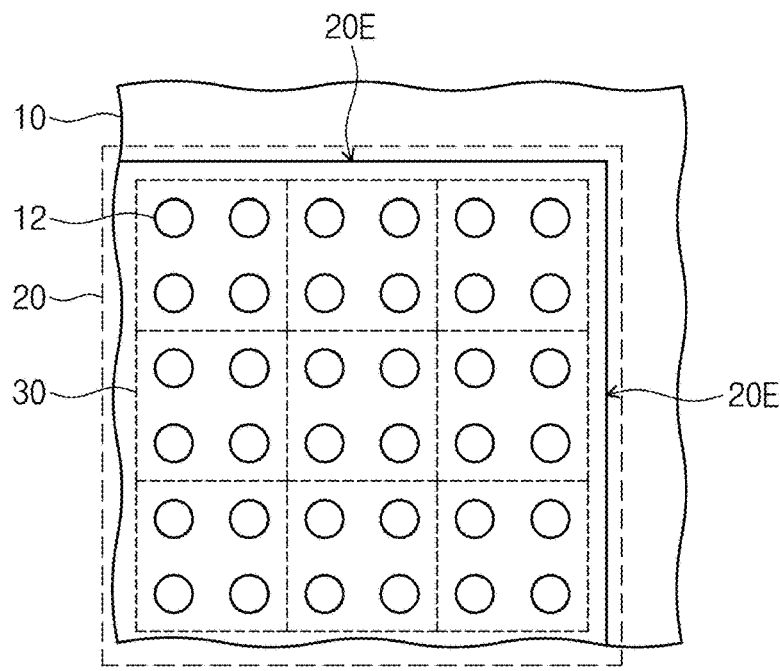

Referring to FIGS. 4 and 10, the correction target region 20 of the mask layout 10 may be divided into a plurality of sub-regions 30 (S222). The correction target region 20 may correspond to a portion of the cell array region 200, and an edge 20E of the correction target region 20 may correspond to the edge 200E of the cell array region 200. The plurality of sub-regions 30 may be different regions in the correction target region 20. Each of the patterns 12 of the mask layout 10 may be provided to have a size corresponding to (or related to) an initial target critical dimension (CD) value CDt_i. For example, the initial target CD value CDt_i may be a CD value initially assigned to a cell pattern that will be formed on the cell array region of the wafer, and each of the patterns 12 of the mask layout 10 may have a dimension (or a size) related to the initial target CD value CDt_i. Each of the plurality of sub-regions 30 may include at least one pattern 12.

Figure 11:
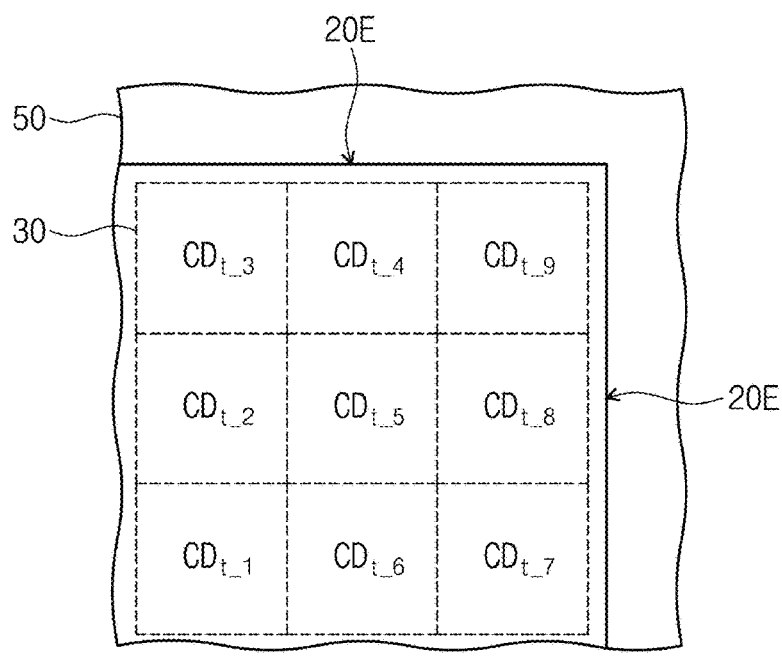

Referring to FIGS. 4 and 11, a revised target CD value CDt_n (where 'n' is an integer equal to or greater than 1) may be set for each of the plurality of sub-regions 30 (S224). Revised target CD values CDt_n may be obtained based on the topography data. The setting of the revised target CD value CDt_n for each of the plurality of sub-regions 30 may be performed by a photolithography simulation using the mask layout 10 and a predetermined process model as input data. The photolithography simulation may be performed by operating/driving the simulation tool 520 of the computer system 500. For example, the predetermined process model may be a set of work process helpful for a photolithography simulation based on input variables, in which input variables may include the topography data of the cell region. The revised target CD value CDt_n may be a CD value which is obtained by revising the initially assigned CD value to the cell pattern that will be formed on the cell array region of the wafer.

Figure 12:
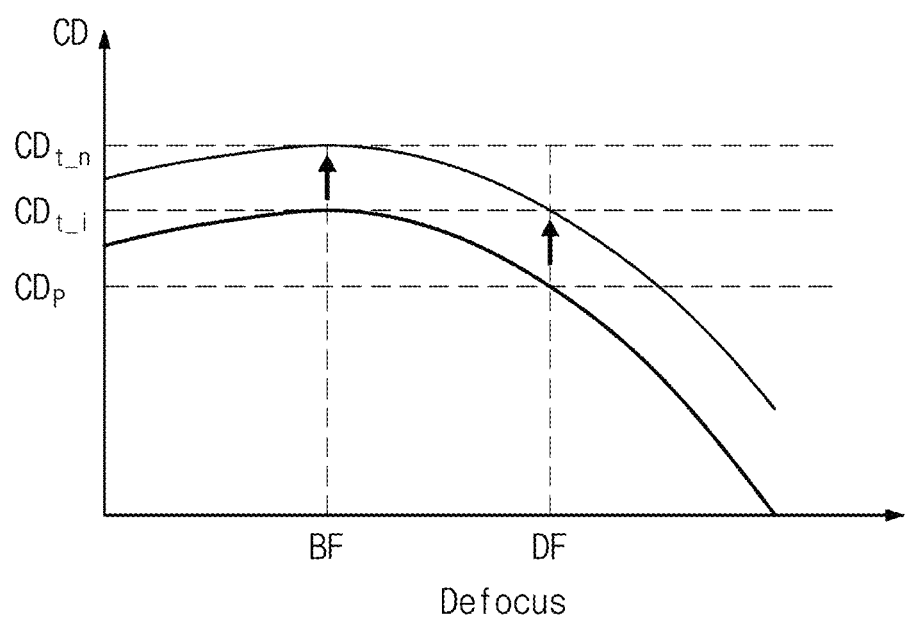

For example, referring to FIGS. 5 and 12, a predictive CD value CDp regarding the pattern 12 in each of the plurality of sub-regions 30 may be generated through the photolithography simulation using the topography data (S10). In this case, the process model used in the photolithography simulation may include data on a CD value of the cell pattern according to focus variation of the photolithography process. The process model may be set in such a way that the focus variation of the photolithography process is dependent on the topography data. For example, as described with reference to FIG. 9, the best focus BF of the photolithography process may be on the center 200C of the cell array region 200, and the degree of the defocus DF of the photolithography process may increase from the center 200C to the edge 200E of the cell array region 200. The initial target CD value CDt_i for each of the sub-regions 30 may be provided.

Figure 8:
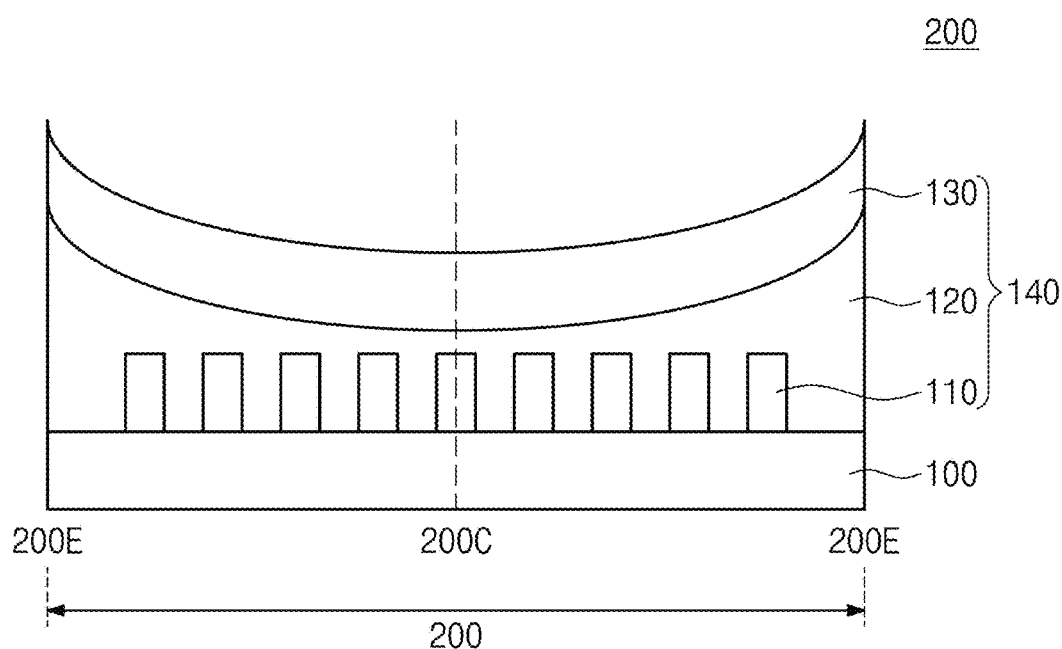

The initial target CD value CDt_i may be a value at the best focus BF of the photolithography process. The pattern 12 of each of the sub-regions 30 of the mask layout 10 may have a size corresponding to (or related to) the initial target CD value CDt_i. The predictive CD value CDp regarding the pattern 12 in each of the sub-regions 30 may be generated by the photolithography simulation using the process model. When defocus occurs in the photolithography process (e.g., DF of FIG. 12), the predictive CD value CDp may be different from the initial target CD value CDt_i (e.g., the predictive CD value CDp may be less than the initial target CD value CDt_i. For example, when a wafer having the topography shown in FIGS. 8 and 9 is processed with a photolithography system in which a CD of a wafer pattern is designed to be less than a size (or a dimension) of a corresponding mask pattern (e.g., the ratio of the wafer pattern to the mask pattern is less than 1), the predictive CD value CDp may be less than the desired CD (for example, the initial target CD value CDt_i) value when defocus occurs. Other examples having different topography may be easily estimated with a geometric logic of magnification/reduction which is similarly used above.

The initial target CD value CDt_i for each of the sub-regions 30 may be revised in such a way that the predictive CD value CDp becomes the desired CD value (e.g., a value equal to the initial target CD value CDt_i) (S20). Thus, the revised target CD value CDt_n for each of the sub-regions 30 may be set. For example, the revised target CD value CDt_n may be a value at a best focus BF of the photolithography process for an uneven (e.g., curved/vent) surface of a wafer. The revising of the initial target CD value CDt_i for each of the sub-regions 30 may be performed by using/driving the data processor 510 of the computer system 500.

Referring again to FIGS. 4 and 11, the defocus map 50 including the revised target CD values CDt_n, which are set for the sub-regions 30 respectively, may be provided (S226). At least some of the revised target CD values in the defocus map 50 may be different from each other. When the degree of the defocus DF of the photolithography process increases from the center 200C to the edge 200E of the cell array region 200 as described with reference to FIG. 9, a difference between the initial target CD value CDt_i and each of the revised target CD values (e.g., CDt_3, CDt_4, CDt_7, CDt_8, and CDt_9) set for the sub-regions 30 adjacent to the edge 20E of the correction target region 20 may be greater than a difference between the initial target CD value CDt_i and each of the revised target CD values (e.g., CDt_1, CDt_2, CDt_5, and CDt_6) set for the sub-regions 30 far away from the edge 20E of the correction target region 20. For example, the revised target CD values (e.g., CDt_3, CDt_4, CDt_7, CDt_8, and CDt_9) set for the sub-regions 30 adjacent to the edge 20E of the correction target region 20 may be greater than the revised target CD values (e.g., CDt_1, CDt_2, CDt_5, and CDt_6) set for the sub-regions 30 far away from the edge 20E of the correction target region 20. The defocus map 50 may be provided by the data processor 510 of the computer system 500.

Figure 13:
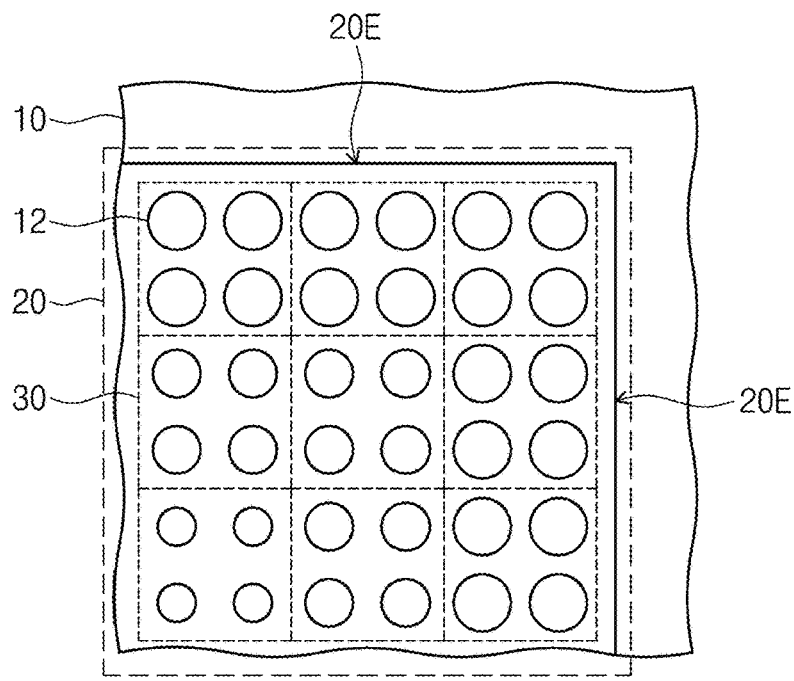

Referring to FIGS. 3 and 13, after the defocus map 50 is generated, the mask layout 10 may be corrected on the basis of the defocus map 50 (S230). The correction of the mask layout 10 may include correcting the patterns 12 of the mask layout 10 in such a way that the pattern 12 in each of the sub-regions 30 has a size corresponding to (or related to) the revised target CD value CDt_n. In this case, at least some of the patterns 12 in the corrected mask layout 10 may have different sizes (e.g., sizes related to different CD values) from each other. When the degree of the defocus DF of the photolithography process increases from the center 200C to the edge 200E of the cell array region 200 as described with reference to FIG. 9, sizes of the patterns 12 in the sub-regions 30 adjacent to the edge 20E of the correction target region 20 may be different from (e.g., greater than) sizes of the patterns 12 in the sub-regions 30 far away from the edge 20E of the correction target region 20. The data processor 510 of the computer system 500 may provide the defocus map 50 to the corrector 530, and the corrector 530 of the computer system 500 may correct the mask layout 10 on the basis of the defocus map 50.

In certain embodiments, the defocus map 50 may include defocus values, e.g., differences in depth from a mask pattern to the surface of the wafer in different sub-regions 30 based on the topography data and/or differences between the initial target CD values CDt_i and the predictive CD values CDp in respective sub-regions 30. In certain embodiments, a correction of mask layout 10 may include producing revised target CD values CDt_n with respect to respective sub-regions which will be applied to the mask layout 10 to produce a corrected mask layout.

Figure 14:
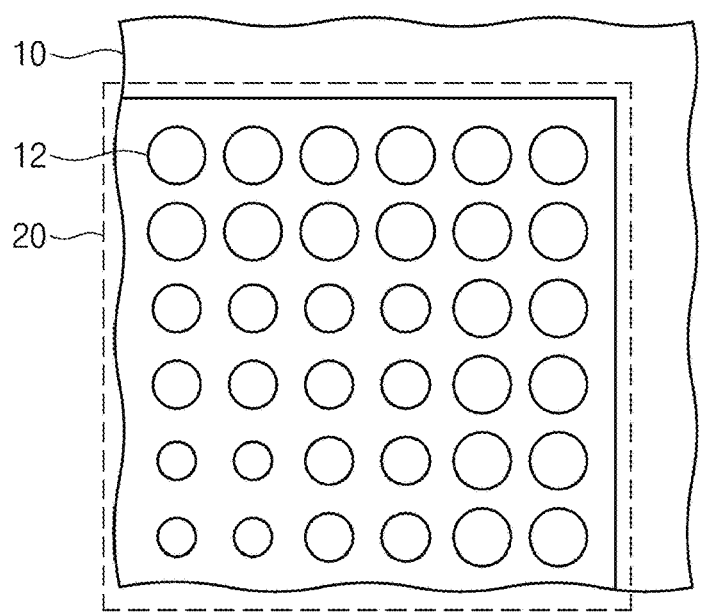

Referring to FIGS. 3 and 14, the corrected mask layout 10 may be verified (S240). The corrected mask layout 10 may include data in an appropriate format (e.g., GDS II) for defining the cell patterns to be printed on the cell array region 200 of the wafer 100. The verification of the corrected mask layout 10 may be performed by the photolithography simulation using the topography data, described with reference to FIGS. 5 and 12. In this case, predictive CD values CDp for the cell patterns to be formed on a wafer with respect to the corrected mask layout 10 may be generated through the photolithography simulation. When a difference between each of the predictive CD values CDp and the desired CD value (e.g., a value equal to the initial target CD value CDt_i of a cell pattern formed on the wafer) is in an allowable range, a subsequent operation (e.g., performing optical proximity correction S300) may be performed on the corrected mask layout 10. When the difference between each of the predictive CD values CDp and the desired CD value (e.g., a value equal to the initial target CD value CDt_i) is out of the allowable range, an operation may return to the operation S220 of FIG. 3. For example, when the difference between a predictive CD value CDp and a desired CD value is out of the allowable range, the previously revised target CD value is revised again, e.g., by adjusting the topography data and/or by adjusting simulation variables calculating the revised target CD values.

Referring to FIGS. 2 and 14, optical proximity correction may be performed on the correction target region 20 of the corrected mask layout 10 (S300). The performing of the optical proximity correction (OPC) may include predicting a contour image, which will be formed on the wafer 100, from the corrected mask layout 10, and additionally correcting the corrected mask layout 10 on the basis of the predicted result. The prediction of the contour image of the corrected mask layout 10 may be performed by a photolithography simulation using the corrected mask layout 10 and a predetermined optical model as input data. The photolithography simulation may be performed by driving/operating the simulation tool 520 of the computer system 500. The optical model may include data on process parameters of the photolithography process, e.g., an intensity and a wavelength of an exposure beam, physical parameters related to an illumination system, and/or physical/chemical characteristics of a photoresist. In addition, the optical model may further include data on process parameters of a subsequent etching process (e.g., using a photoresist pattern formed by the photolithography process as an etch mask). The additional correction of the corrected mask layout 10 may include comparing the contour image with a desired image, and additionally correcting the patterns 12 of the corrected mask layout 10 when a difference between the contour image and the desired image is out of an allowable range. Methods of adding or removing patterns equal to or less than a resolution to or from the patterns 12 of the corrected mask layout 10 may be used in the additional correction of the corrected mask layout 10. The additional correction of the corrected mask layout 10 may be performed by driving the corrector 530 of the computer system 500.

When the difference between the contour image and the desired image is in the allowable range, a final mask layout may be obtained (S400).

Generally, in the event that the cell structure 140 provided on the cell array region 200 of the wafer 100 has an uneven (e.g., bent/curved) topography, the photolithography process performed on the cell structure 140 may defocus on specific regions of the cell array region 200. If each of the patterns 12 of the mask layout 10 has a size corresponding to (or relative to) the initial target CD value CDt_i, the patterns 12 may be printed in distorted shapes different from a designed shape on the specific regions of the cell array region 200 by the defocus of the photolithography process. Since optical proximity correction of the mask layout 10 is performed regardless of the topography of the cell structure 140, it may not be sufficient to compensate the distortion of the layout which may be caused by the defocus of the photolithography process depending on the topography of the cell structure 140.

According to the inventive concepts, the topography data on the cell array region 200 may be obtained, and the defocus map 50 may be generated using the topography data. The defocus map 50 may include the revised target CD values CDt_n respectively set for the plurality of sub-regions 30 of the correction target region 20 of the mask layout 10. The process proximity correction on the mask layout 10 may be performed based on the defocus map 50 generated using the topography data, and thus the distortion of the layout by the defocus of the photolithography process may be compensated when the photolithography process is performed using the corrected mask layout 10. For example, the process proximity correction and/or using the topography data is beneficial to provide the method for correcting the mask layout, which may compensate the distortion of the layout caused by the uneven (e.g., bent/curved) topography of the cell array region 200 of the wafer 100.

Figure 15:
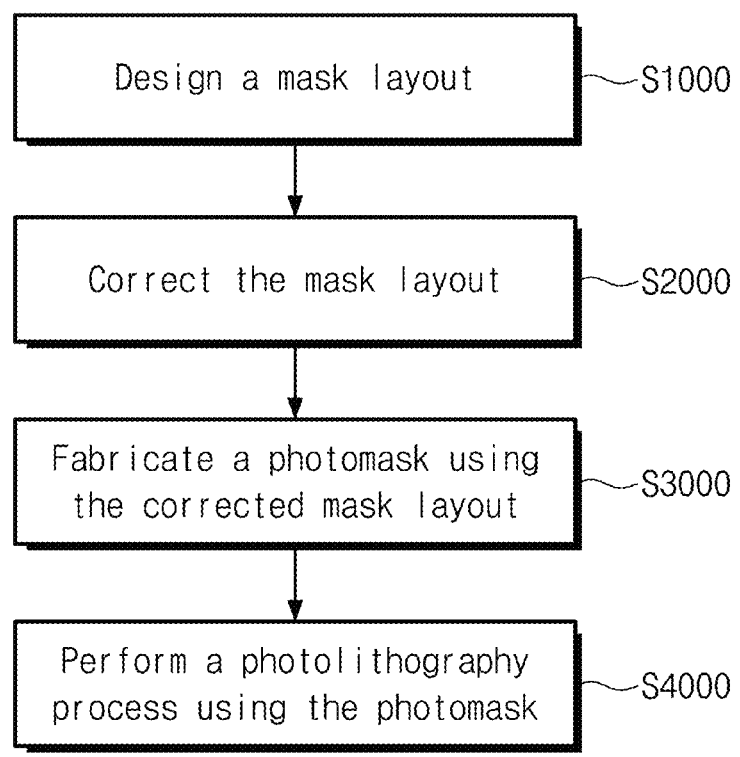
FIG. 15 is a flowchart illustrating a method of fabricating a semiconductor device using a method for correcting a mask layout, according to some embodiments of the inventive concepts.
Figure 16:
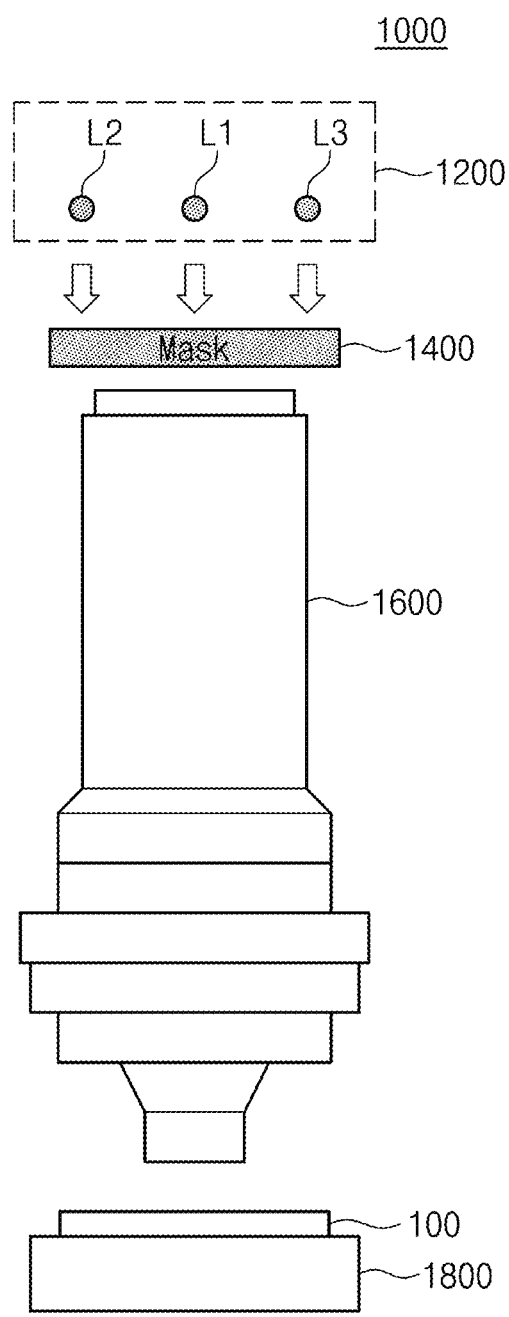
FIG. 16 is a conceptual diagram illustrating a photolithography system used in a method of fabricating a semiconductor device, according to some embodiments of the inventive concepts.

FIG. 15 is a flowchart illustrating a method of fabricating a semiconductor device using a method for correcting a mask layout, according to some embodiments of the inventive concepts. FIG. 16 is a conceptual diagram illustrating a photolithography system used in a method of fabricating a semiconductor device, according to some embodiments of the inventive concepts.

Referring to FIG. 15, the mask layout 10 may be designed (S1000). The design of the mask layout 10 may be performed using electronic design automation (EDA) software. The mask layout 10 may include the patterns 12 to be printed in the integrated circuit on the wafer. The mask layout 10 may include data in an appropriate format (e.g., GDS II).

The mask layout 10 may be corrected (S2000). The correction of the mask layout 10 may include providing the mask layout 10 (S100), performing the process proximity correction based on the defocus map 50 on the mask layout 10 (S200), performing the optical proximity correction on the mask layout 10 (S300), and obtaining the finally corrected mask layout 10 (S400), as described with reference to FIG. 2. The performing of the process proximity correction based on the defocus map 50 on the mask layout 10 may be the same as described with reference to FIGS. 3 to 14.

A photomask may be fabricated using the corrected mask layout 10 (S3000). The fabrication of the photomask may include providing a blank mask having a metal layer (e.g., a chromium (Cr) layer) and a photoresist layer on a quartz substrate, transferring the corrected mask layout onto the photoresist layer of the blank mask, developing the photoresist layer to form photoresist patterns including patterns corresponding to the corrected mask layout, and etching the metal layer of the blank mask by using the photoresist patterns as an etch mask. The photomask may include mask patterns corresponding to the corrected mask layout by the etching process.

Referring to FIGS. 15 and 16, a photolithography process using the photomask may be performed (S4000). The photolithography process may be performed to print patterns corresponding to the mask patterns of the photomask on the wafer 100. The photolithography process may be performed using a photolithography system 1000. The photolithography system 1000 may include a light source 1200, the photomask 1400, a reduction projection unit 1600, and a wafer stage 1800.

The light source 1200 may emit light. The light emitted from the light source 1200 may be irradiated or provided to the photomask 1400. In some embodiments, a lens may be provided between the light source 1200 and the photomask 1400 to adjust a focus of the light. The light source 1200 may include an ultraviolet light source (e.g., a KrF light source having a wavelength of 234 nm or an ArF light source having a wavelength of 193 nm). The light source 1200 may include a single point light source L1. However, embodiments of the inventive concepts are not limited thereto. In certain embodiments, the light source 1200 may include a plurality of point light sources L1, L2 and L3.

The photomask 1400 may include the mask patterns used to print an integrated circuit layout on the wafer 100. The photomask 1400 may include a transparent region and an opaque region, and the mask patterns may be formed by the transparent and opaque regions. The transparent region may be formed by etching the metal layer on the photomask 1400, as described above. The transparent region may transmit the light emitted from the light source 1200. On the other hand, the opaque region may not transmit the light but may block the light. While photomask 1400 of FIG. 16 is disposed between the light source L1 and the wafer stage 1800, embodiments of the present disclosure are not limited thereto. For example, the photomask 1400 may be disposed away from an imaginary line connecting the light source L1 and the wafer stage 1800. In this case, the opaque region of the photomask 1400 may reflect light irradiated from the light source L1 to a wafer disposed on the wafer stage so that a patterned light irradiates a surface of the wafer 100 to expose a photoresist layer formed on the wafer 100. When the photomask 1400 is disposed between the light source L1 and the wafer stage 1800 as shown in FIG. 16, a light pattern formed by transmitting through the photomask 1400 may irradiate a surface of the wafer 100 disposed on the wafer stage 1800 to expose a photoresist layer formed on the wafer 100.

The reduction projection unit 1600 may receive the light transmitted through the transparent region of the photomask 1400. The reduction projection unit 1600 may match circuit patterns of a layout to be printed on the wafer 100 with the mask patterns of the photomask 1400. The wafer stage 1800 may support the wafer 100.

In some embodiments, the reduction projection unit 1600 may include an aperture. The aperture may be used to increase a depth of a focus of ultraviolet light emitted from the light source 1200. For example, the aperture may include a dipole aperture or a quadruple aperture. In some embodiments, the reduction projection unit 1600 may further include a lens for adjusting a focus of light.

The light transmitted through the transparent region of the photomask 1400 may be irradiated or provided to the wafer 100 through the reduction projection unit 1600. Thus, patterns corresponding to the mask patterns of the photomask 1400 may be printed on the wafer 100.

Thereafter, subsequent processes for fabricating a semiconductor device may be performed on the wafer 100, and thus the semiconductor device may be fabricated on the wafer 100.

Generally, in the event that the cell structure 140 provided on the cell array region 200 of the wafer 100 has an uneven (e.g., bent/curved) topography, the patterns 12 of the mask layout 10 may be printed in distorted shapes different from a designed shape on specific regions of the cell array region 200 by the defocus of the photolithography process which is caused by the uneven topography of the cell structure 140. In this case, a CD dispersion of cell patterns formed on the cell array region 200 may be increased.

According to the inventive concepts, in an operation of designing a semiconductor device, the mask layout 10 may be corrected based on the defocus map 50 generated using the topography data of the cell array region 200. The photomask 1400 may be fabricated using the corrected mask layout 10. The photolithography process may be performed using the photomask 1400 to compensate the distortion of the layout by the defocus of the photolithography process. Thus, the CD dispersion of the cell patterns formed on the cell array region 200 may be reduced or minimized. As a result, the method of fabricating the semiconductor device is provided, and the method may reduce or minimize the CD dispersion of the cell patterns on the cell array region 200 of the wafer 100.

According to the inventive concepts, the method for correcting the mask layout is provided, and the method may compensate the distortion of the layout by the uneven topography of the cell array region of the wafer. For example, the method of fabricating the semiconductor device is provided, and the method may reduce or minimize the CD dispersion of the cell patterns formed on the cell array region of the wafer.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of correcting a mask layout, the method comprising:
   providing a mask layout including first patterns, each of the first patterns having a size related to a first critical dimension (CD) value;
   obtaining topography data on a region of a wafer;
   generating a defocus map using the topography data; and
   correcting the mask layout on a basis of the defocus map,
   wherein the generating of the defocus map comprises respectively setting second CD values for a plurality of sub-regions of the mask layout,
   wherein the second CD values are set based on the topography data,
   wherein the correcting of the mask layout on the basis of the defocus map comprises correcting sizes of the first patterns to be related to the second CD values,
   wherein the first patterns of the mask layout are configured to print second patterns in an integrated circuit on the wafer,
   wherein the defocus map includes the second CD values respectively set for the plurality of sub-regions of the mask layout, and
   wherein the correcting of the mask layout on the basis of the defocus map comprises: correcting the first patterns of the mask layout in such a way that each of the first patterns of the plurality of sub-regions have a corrected size related to each of the second CD values.

2. The method of claim 1,
   wherein the setting of the second CD values for the plurality of sub-regions of the mask layout comprises:
   generating a predictive CD value of the second patterns to be printed on the wafer corresponding to each of the plurality of sub-regions by a photolithography simulation using the mask layout and a process model as input data; and
   revising the first CD value for each of the plurality of sub-regions in such a way that the predictive CD value becomes a third CD value.

3. The method of claim 2, wherein the process model includes data on a CD value of the second patterns according to a focus variation of a photolithography process, and
   wherein the process model is set in such a way that the focus variation of the photolithography process is dependent on the topography data.

4. The method of claim 1, wherein the generating of the defocus map comprises:
   dividing a region of the mask layout into the plurality of sub-regions; and
   providing the defocus map including the second CD values set for the plurality of sub-regions respectively.

5. The method of claim 1, wherein the first patterns of the mask layout have the same size related to the first CD value in the plurality of sub-regions and are repeatedly arranged, and wherein at least some of the second CD values of different sub-regions are different from each other.

6. The method of claim 1, wherein the topography data is obtained by measuring a surface profile of the region of the wafer by using a scanning probe microscope.

7. The method of claim 1, wherein the first patterns of the mask layout corresponds to cell patterns to be printed on a cell array region of the wafer, and wherein the topography data is obtained from the cell array region of the wafer.

8. The method of claim 1, further comprising:

correcting the mask layout by performing optical proximity correction.

9. The method of claim 1, wherein the topography data is obtained by measuring a height of a surface of the region of the wafer through destructive inspection.

10. A method of manufacturing a semiconductor device, the method comprising:

designing a mask layout including first patterns, each of the first patterns having a size related to a first critical dimension (CD) value;

correcting the mask layout;

fabricating a photomask having mask patterns corresponding to the corrected mask layout; and performing a photolithography process using the photomask on a wafer, wherein the correcting of the mask layout comprises:

generating a defocus map using topography data on a region of the wafer; and correcting the mask layout on a basis of the defocus map, wherein the generating of the defocus map comprises respectively setting second CD values for a plurality of sub-regions of the mask layout, wherein the second CD values are set based on the topography data, wherein the first patterns of the mask layout have the same size related to the first CD value in the plurality of sub-regions and are repeatedly arranged, wherein the defocus map includes the second CD values respectively set for the plurality of sub-regions of the mask layout, and wherein the correcting of the mask layout on the basis of the defocus map comprises correcting the first patterns of the mask layout in such a way that each of the first patterns in each of the plurality of sub-regions have a corrected size related to each of the second CD values.

11. The method of claim 10, wherein the topography data is obtained by measuring a surface profile of the region of the wafer by using a scanning probe microscope.

12. The method of claim 10, wherein the topography data is obtained by measuring a height of a surface of the region of the wafer through destructive inspection.

13. The method of claim 10, wherein the generating of the defocus map comprises:

dividing a region of the mask layout into the plurality of sub-regions; and providing the defocus map including the second CD values set for the plurality of sub-regions respectively.

14. The method of claim 10, wherein at least some of the second CD values respectively set for the plurality of sub-regions of the mask layout are different from each other.

15. The method of claim 10, wherein the correcting of the mask layout further comprises correcting the mask layout by performing optical proximity correction.

16. The method of claim 10, wherein the mask layout includes the first patterns corresponding to cell patterns to be printed on a cell array region of the wafer, and wherein the topography data is obtained from the cell array region of the wafer.

17. The method of claim 10, wherein the setting of the second CD values for the plurality of sub-regions of the mask layout comprises:

generating a predictive CD value of a second pattern to be formed on the wafer corresponding to each of the plurality of sub-regions by a photolithography simulation using the mask layout and a process model as input data; and revising the first CD value for each of the plurality of sub-regions in such a way that the predictive CD value becomes a third CD value.

18. The method of claim 17, wherein the process model includes data on a CD value of the second pattern according to a focus variation of a photolithography process, and wherein the process model is set in such a way that the focus variation of the photolithography process is dependent on the topography data.

19. A method of manufacturing a semiconductor device, the method comprising:

designing a mask layout including first patterns, each of the first patterns having a size related to a first critical dimension (CD) value;

correcting the mask layout;

fabricating a photomask having mask patterns corresponding to the corrected mask layout; and performing a photolithography process using the photomask on a wafer, wherein the correcting of the mask layout comprises:

generating a defocus map using topography data on a region of the wafer; and correcting the mask layout on a basis of the defocus map, wherein the generating of the defocus map comprises respectively setting second CD values for a plurality of sub-regions of the mask layout, wherein the second CD values are set based on the topography data, wherein the first patterns of the mask layout have the same size related to the first CD value in the plurality of sub-regions and are repeatedly arranged, wherein the setting of the second CD values for the plurality of sub-regions of the mask layout comprises:

generating a predictive CD value of a second pattern to be formed on the wafer corresponding to each of the plurality of sub-regions by a photolithography simulation using the mask layout and a process model as input data; and revising the first CD value for each of the plurality of sub-regions in such a way that the predictive CD value becomes a third CD value.

20. The method of claim 19, wherein the process model includes data on a CD value of the second pattern according to a focus variation of the photolithography process, and wherein the process model is set in such a way that the focus variation is dependent on the topography data.

* * * * *